United States Patent [19]

Kumagai

[11] 4,086,473
[45] Apr. 25, 1978

[54] DISPLAY DEVICE FOR ELECTRONIC APPARATUS

[75] Inventor: Shigeki Kumagai, Yokohama, Japan

[73] Assignee: Tokyo Shibaura Electric Co., Ltd., Tokyo, Japan

[21] Appl. No.: 767,114

[22] Filed: Feb. 9, 1977

[30] Foreign Application Priority Data

Feb. 10, 1976 Japan .................................. 51-13553

[51] Int. Cl.² .......................................... H03K 21/22
[52] U.S. Cl. ............................ 235/92 EA; 235/92 T; 235/92 R; 58/50 R
[58] Field of Search ............ 235/92 T, 92 EA, 92 FP; 58/23 BA, 23 A, 24 A, 50 R; 340/336

[56] References Cited

U.S. PATENT DOCUMENTS

| 3,395,268 | 7/1968 | Barton | 235/92 EA |
| 3,714,867 | 2/1973 | Dargent | 58/50 R |
| 3,755,806 | 8/1973 | Bunting | 235/92 EA |
| 3,812,489 | 5/1974 | Reiji Hirano et al. | 235/92 T |
| 3,876,867 | 4/1975 | Schull et al. | 235/92 T |

Primary Examiner—Joseph M. Thesz
Attorney, Agent, or Firm—Finnegan, Henderson, Farabow & Garrett

[57] ABSTRACT

A display device includes a time display information generating circuit for generating a time display information signal, an amplifier circuit for amplifying the time display information signal from the time display information generating circuit, and a dynamic drive type display unit driven by amplified display information signals from the amplifier circuit. The display information signals of the time display information generating circuit are supplied to the amplifier circuit through a gate circuit adopted to selectively block display information signals of the display information circuit.

6 Claims, 4 Drawing Figures

DISPLAY DEVICE FOR ELECTRONIC APPARATUS

BACKGROUND OF THE INVENTION

This invention relates to a display device for electronic apparatus, and in particular a display device for electronic apparatus, such as an electronic timepiece, including an electronic device required to be maintained always in an operative state.

With the recent advancements of electronic techniques a variety of mechanically driven devices are gradually being replaced by electronically driven ones. Of instruments incorporated in an automobile, for example, a timepiece is being replaced by an electronic one having a light emitting display unit. The use of such an electronic device increases the dissipation power of an automobile battery and, because of a limited capacity of the automobile battery, electronic devices incorporated into the automobile are designed to make the dissipation power as little as possible. Since the electronic timepiece must be maintained always in an operative state, it is necessary to sufficiently lower the dissipation power of the electronic timepiece. Such an electronic time-piece has a light emitting display device adopted to provide a visual time indication in a digital fashion. The light emitting display device is so constructed to display time indication only when a time display is required. For example, when the automobile is stopped or parked, only a display information generating circuit such as a time information generating circuit of the electronic timepiece is operated and a supply of electric power to the display device is interrupted. In the conventional electronic timepiece, however, a power supply to the display device is effected by disconnecting the automobile battery, and a digit drive signal from a driver in a display information generating circuit of the electronic timepiece continues to be supplied to an amplifier circuit which is constructed of emitter grounded transistors and connected to a display unit in the display device. For this reason, a leakage current continues to flow through the base-emitter paths of the transistors in the amplifier circuit. In consequence, the electronic timepiece connected to the automobile battery dissipates a leakage current and an electric current through the time information generating circuit which needs to be maintained always in an operative state. This causes the automobile battery to overcharge.

SUMMARY OF THE INVENTION

It is accordingly the object of this invention to provide a low power consumption type display device for electronic apparatus which can prevent leakage current.

According to this invention there is provided a display device for electronic apparatus, including a gate circuit connected between a display information signal circuit and a display circuit and adapted to block a supply of display information signal to a display circuit when the display device is in the nondisplay state.

DETAILED DESCRIPTION OF THE INVENTION

Figure 1:
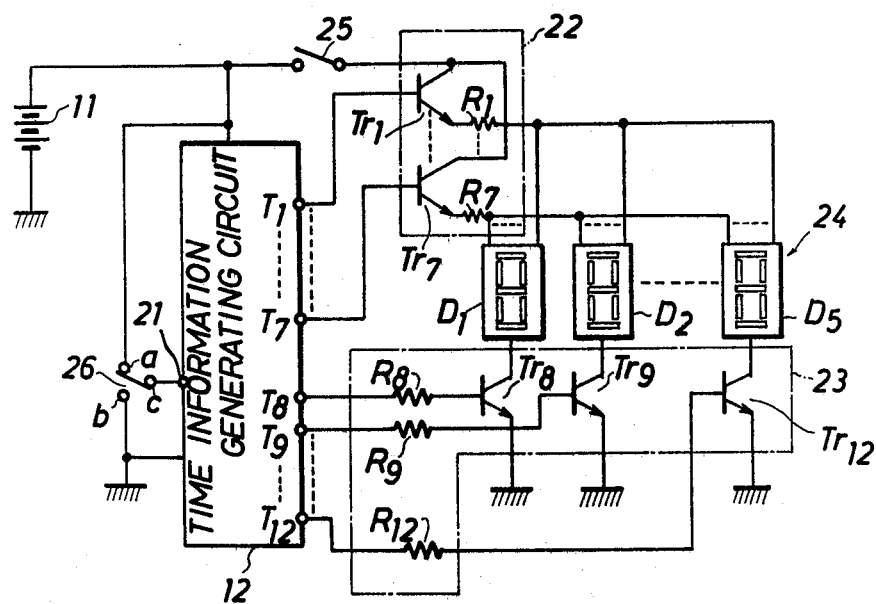
FIG. 1 is a circuit diagram showing a display device for electronic apparatus which is according to one embodiment of this invention.
Figure 2:
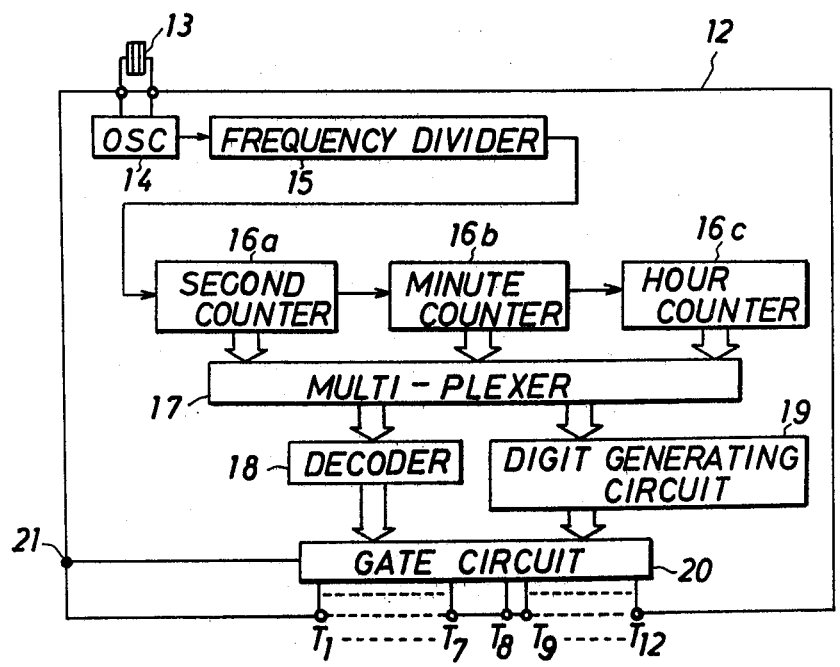
FIG. 2 is a block diagram showing an LSI time information generating circuit.

In FIG. 1 a power source 11, for example an automobile battery, is connected to a display signal generating circuit, for example, a time information generating circuit 12 having, for example, a CMOS-LSD arrangements. As shown in FIG. 2 the time information generating circuit 12 includes an oscillation circuit 14 connected to, for example, a quartz oscillator 13; a frequency divider 15 for frequency dividing an oscillation frequency of the oscillation circuit into a predetermined frequency; second; minute and hour counter circuit 16a, 16b and 16c adapted to count the output pulses of the frequency divider according to time units, for example, seconds, minutes and hours, respectively; a multiplexer 17 for receiving the outputs of the counter circuits 16a, 16b and 16c; a decoder for receiving binary outputs of the multiplexer; and a digit generating circuit for receiving binary outputs of the multiplexer. The time information generating circuit 12 further includes a gate circuit 20 for blocking the outputs of the decoder 18 and digit generating circuit 19 by a blanking signal which is supplied to a blanking signal input terminal 21. Output terminals $T_1 \ldots T_7$ of the gate circuit 20 in the time information generating circuit 12 are connected to the bases of transistors $T_{r1} \ldots T_{r7}$ which constitute an amplifier circuit in FIG. 1. The remaining output terminals $T_8 \ldots T_{12}$ of the gate circuit 20 are connected respectively through resistors $R_8 \ldots R_{12}$ to the base of transistors $T_{r8} \ldots T_{r12}$ which constitute an amplifier circuit 23. The emitters of the transistors $T_{r1} \ldots T_{r7}$ in the amplifier circuit 22 are connected respectively through resistors $R_1 \ldots R_7$ to corresponding display segments of display sections $D_1 \ldots D_5$ constituting a display unit 24, or the anodes of seven light emitting diodes (LED's) arranged, for example, in a figure "eight" pattern. The collectors of the transistors $T_{r1} \ldots T_{r7}$ are connected to the power source 11 through an ignition switch (not shown) or a switch 25 in interlock with the ignition switch. The cathodes of LED's constituting the display sections $D_1$ to $D_5$ of the display unit 24 are connected to common terminals (not shown). The common terminals of the display sections $D_1 \ldots D_5$ are grounded through the emitter-collector paths of the transistors $T_{r8} \ldots T_{r12}$. The abovementioned blanking signal input terminal 21 is connected to a common contact C of a changeover switch 26 which is in interlock with the ignition switch. One contact $a$ of the changeover switch 26 is connected to the power source 11 and the other contact $b$ of the changeover switch is grounded.

Figure 3:
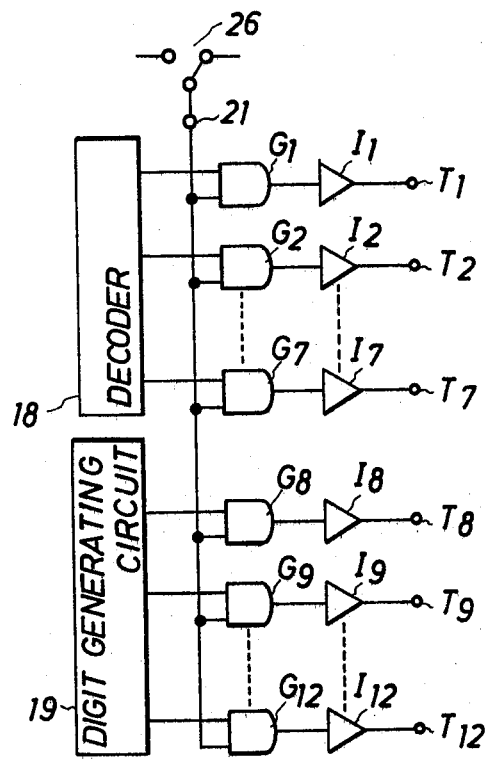
FIG. 3 is a circuit diagram showing a gate circuit in FIG. 2.

As shown in FIG. 3 the gate circuit 20 comprises AND gates $G_1$ to $G_7$ each having an input terminal adapted to receive from the decoder 18 a segment signal for driving the display section, AND gates $G_8$ to $G_{12}$ each having an input terminal adapted to receive a digit signal from the digit generating circuit 19, and inverters $I_1 \ldots I_{12}$ connected to the outputs of the AND gates $G_1 \ldots G_{12}$. That is, the gate circuit 20 comprises a plurality of NAND gates which are constituted of AND gates $G_1 \ldots G_{12}$ and inverters $I_1 \ldots I_{12}$. The other input terminal of each of the AND gates $G_1 \ldots G_{12}$ is connected in common with the blanking signal input terminal 21. The operation of the display device according to this invention will be explained below by referring to FIGS. 1 to 3.

When the power source 11 is connected, the time information generating circuit 12 is operated to permit the oscillation circuit 14 to generate an oscillation frequency of, for example, 32.768 KHz. The output of the oscillation circuit is frequency divided by the frequency divider 15 into a predetermined frequency which is serially supplied to the second counter 16a, minute counter 16b and hour counter 16c in this order. These counters 16a, 16b and 16c supply pulse signals corresponding to seconds, minutes and hours, respectively, to the multiplexer 17. Signals corresponding to numerical characters representative of seconds, minutes and hours are supplied from the multiplexer 17 to the decoder 18 where they are decoded into a 7-segment signal. A digit designating signal from the multiplexer 17 is converted at the digit generating circuit 19 into a digit designating drive signal. The drive signals of the decoder 18 and digit generating circuit 19 are each supplied to one input terminal of each of the AND gates $G_1 \ldots G_{12}$.

If in this state the switch 25 is closed and the switch 26 is thrown on the power source side contact a, the AND gates $G_1 \ldots G_{12}$ are opened to cause drive signals to be supplied to the bases of the transistors $T_1$ to $T_{12}$ respectively through the inverters $I_1$ to $I_{12}$. As a result, the transistors $T_1$ to $T_{12}$ are rendered conductive, causing a drive current to be supplied to the display sections $D_1$ to $D_5$ in the display unit 24 to permit a time display of the display unit 24.

When the switch 25 is opened, a drive current is not supplied to LED's in the display sections $D_1$ to $D_5$ of the display unit 24, the display 24 stops its light emission. If at this time the switch 26 is on the side of the contact a, a leak current flows through the gate circuit 20 and base-emitter paths of the transistors $T_8$ to $T_{12}$. In consequence, the switch 26 is gauged with the opening of the switch 25 and thrown on the side of the contact b. A blanking signal, i.e., a ground potential signal is supplied to the other input terminal of each of the AND gates $G_1 \ldots G_{12}$ in the gate circuit 20, causing the AND Gates $G_1 \ldots G_{12}$ to be disabled and permitting drive signals from the decoder 18 and digit generating circuit 19 to be blocked by the gate circuit 20. As a result, no leakage current flows through the base-emitter paths of the transistors, completely stopping a time display. Since, however, the time information generating circuit 12 is connected directly to the power 11, it continues its operation and generates a signal always representing the correct time.

Figure 4:
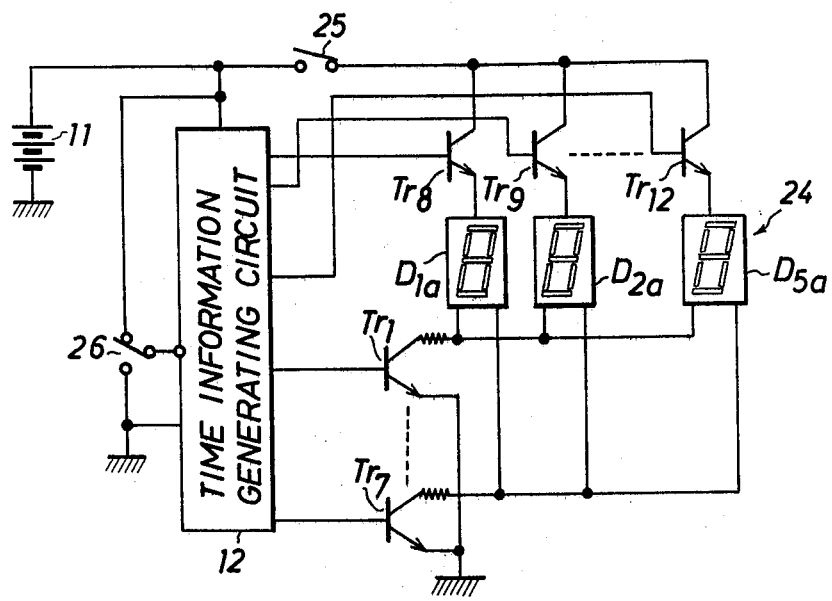
FIG. 4 is a circuit diagram showing a display device for electronic apparatus which is according to another embodiment of this invention.

By arbitrarily blocking drive signals from the decoder 18 and digit generating circuit 19 as explained above, a leakage current is prevented, lowering a dissipation current of the automobile battery and preventing a battery overcharge. Although all the AND gates $G_1$ to $G_{12}$ are explained as delivering drive signals, it will be understood that the AND gates $G_1$ to $G_{12}$ deliver drive signals operatively according to the display time. FIG. 4 shows a display device using anode common type display sections $D_{1a}$ to $D_{5a}$. Even in the embodiment shown in FIG. 4 blanking signals are supplied to the gate circuit 20 and in consequence a supply of drive signals is prevented by the gate circuit, thus preventing a leakage current through the base-emitter paths of transistors $T_1$ to $T_7$ which control display segments of display sections. In the embodiments of FIGS. 1 and 4, npn transistors are used as amplifier transistors $T_1$ to $T_{12}$. In this case, the display unit is designed to effect a time display when both segments signals and digits signals are at a high level. When, on the other hand, the display unit is designed to be driven by low level segment and digit signals or a combination of high- and low-level segment and digit signals, pnp transistors or a combination of npn and pup transistors are respectively used according to the level of the signals. The amplifier transistors $T_{r1}$ to $T_{r12}$ may be incorporated, together with the time information generating circuit 12, in a CMOS-LSI form in the display device, or may be separately provided. This invention can be applied not only to an electronic timepiece for automobiles, but also to a household clock, a wrist watch, an odometer or a fuel gauge.

What is claimed is:

1. A display device for electronic apparatus comprising a display information generating circuit which comprises a time display information generating circuit including an oscillator, a frequency divider for frequency dividing an oscillation frequency of the oscillator, a counter circuit for counting output pulses of the frequency divider according to time units, a multiplexer for receiving outputs of the counter and generating binary time information, a decoder for generating segment drive signals and digit generating circuit for generating digit drive signals responsive to the binary time information generated by said multiplexer, blanking signal generating means for selectively generating blanking signals; a gate circuit having a plurality of first input terminals for receiving the segment drive signals of said decoder and digit drive signals of said digit generating circuit, second input terminals for receiving a blanking signal of said blanking signal generating means, and output terminals corresponding to said segment drive signals and said digit drive signals, and adapted to block both the drive signals when said blanking signal is received; a first amplifier circuit for amplifying the segment drive signals from the output terminals of the gate circuit; a second amplifier circuit for amplifying the digit drive signals from the output terminals of the gate circuit; and a dynamic drive type display unit comprising a plurality of display sections each constructed of a plurality of display segments adapted to receive amplified segment drive signals of the first amplifier circuit, said plurality of display sections being adapted to receive amplified digit drive signals from the second amplifier circuit.

2. A display device according to claim 1, in which said gate circuit comprises a plurality of AND gates having first input terminals corresponding to the segment drive signals of the decoder and digit drive signals of the digit generating circuit and adapted to receive corresponding signals, second input terminals for receiving the blanking signal of said blanking signal generating means, and output terminals connected to said first and second amplifier circuits.

3. A display device according to claim 1, in which said first amplifier circuit comprises a plurality of first transistors for amplifying segment drive signals from the output terminals of the gate circuit, each of said first transistors having a base adapted to receive a corresponding segment drive signal, an emitter connected to a corresponding display segment in each display section and a collector connected to the power source; and said second amplifier circuit comprises a plurality of second transistors having bases adapted to receive the respective digit drive signals and a collector-emitter path connected to a common electrode of a corresponding display section.

4. A display device according to claim 1, in which said blanking signal generating means is constructed of a switch adapted to be switched selectively to a predetermined potential source or ground.

5. A display device according to claim 1, in which each of the display sections in the display unit is of a cathode common type.

6. A display device according to claim 1, in which each of the display sections in the display unit is of an anode common type.

* * * * *